(12) United States Patent
Lee et al.

(10) Patent No.: US 10,410,839 B2
(45) Date of Patent: Sep. 10, 2019

(54) METHOD OF PROCESSING A SUBSTRATE USING AN ION BEAM AND APPARATUS FOR PERFORMING THE SAME

(71) Applicant: Samsung Electronics Co., Ltd., Suwon-si (KR)

(72) Inventors: Yil-Hyung Lee, Hwaseong-si (KR); Yoo-Chul Kong, Seoul (KR); Jong-Kyu Kim, Seongnam-si (KR); Seok-Woo Nam, Seongnam-si (KR); Jong-Soon Park, Suwon-si (KR); Kyoung-Sub Shin, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/606,025

(22) Filed: May 26, 2017

(65) Prior Publication Data

US 2018/0197719 A1    Jul. 12, 2018

(30) Foreign Application Priority Data

Jan. 6, 2017  (KR) .................. 10-2017-0002342

(51) Int. Cl.
*H01L 21/263* (2006.01)
*H01J 37/32* (2006.01)
*H01J 37/34* (2006.01)

(52) U.S. Cl.
CPC .. *H01J 37/32412* (2013.01); *H01J 37/32422* (2013.01); *H01J 37/3435* (2013.01); *H01J 37/3438* (2013.01); *H01J 2237/083* (2013.01); *H01J 2237/334* (2013.01)

(58) Field of Classification Search
CPC .......... H01J 37/32412; H01J 37/32422; C23C 14/34; H01L 21/2633
See application file for complete search history.

(56) References Cited

U.S. PATENT DOCUMENTS

| | | | |
|---|---|---|---|
| 8,900,402 B2 | 12/2014 | Holland et al. | |
| 9,017,526 B2 | 4/2015 | Singh et al. | |
| 9,147,581 B2 | 9/2015 | Guha | |
| 9,245,761 B2 | 1/2016 | Singh et al. | |
| 9,303,314 B2 | 4/2016 | Adibi et al. | |
| 9,318,332 B2 | 4/2016 | Prabhakar et al. | |
| 9,406,535 B2 | 8/2016 | Berry, III et al. | |
| 2007/0283709 A1 | 12/2007 | Luse et al. | |
| 2015/0287567 A1 | 10/2015 | Tsujiyama et al. | |
| 2016/0351377 A1* | 12/2016 | Okamoto | H01J 37/32357 |

* cited by examiner

*Primary Examiner* — Thomas T Pham
(74) *Attorney, Agent, or Firm* — Onello & Mello, LLP

(57) ABSTRACT

In an example embodiment a method of processing a substrate includes forming a plasma in a plasma chamber and using charged grids to form an ion beam and to thereby accelerate ions from the plasma chamber to a processing chamber. An auxiliary heater, which may be a radiant heater, may be used to pre-heat a grid to a saturation state to accelerate heating and concomitant distortion of the grid. A process recipe may pre-compensate for distortion of the grid.

15 Claims, 20 Drawing Sheets

METHOD OF PROCESSING A SUBSTRATE USING AN ION BEAM AND APPARATUS FOR PERFORMING THE SAME

CROSS-RELATED APPLICATION

This application claims priority under 35 USC § 119 to Korean Patent Application No. 2017-0002342, filed on Jan. 6, 2017 in the Korean Intellectual Property Office (KIPO), the contents of which are herein incorporated by reference in their entirety.

BACKGROUND

1. Field

Example embodiments relate to a method of processing a substrate using an ion beam and an apparatus for performing the same. More particularly, example embodiments relate to a method of etching a layer on a substrate or forming a layer on a substrate using an ion beam, and an apparatus for performing the method.

2. Description of the Related Art

In an etching method using an ion beam, ions in plasma generated in a plasma chamber may pass through grids to be converted, or collimated, into an ion beam. The ion beam may process a substrate in a substrate-processing chamber.

One or more of the grids, particularly a grid closest to plasma generator may be heated by heat of the plasma and may expand. Such expansion may lead to an increase in the gap between the grids. As a result, characteristics of the ion beams passing through openings between the grids may be changed so that an etching rate may not be uniformly maintained. Because it may be difficult to prevent the expansion of the grid, recipes of a substrate-processing process may be set based on the expansion of the grid. That is, substrate processing may pre-compensate for grid expansion and, as a result, substrate processing may be delayed until the grid is expanded.

According to related arts, a dummy substrate may be placed in the substrate-processing chamber and a plasma generated to pre-heat and pre-expand the grid prior to substrate processing.

However, the time required to pre-heat the grid using the plasma may be excessive and the process for generating the plasma may be complicated. As a result, employing a pre-heated grid using the dummy substrate may decrease the yield of a semiconductor device.

SUMMARY

Example embodiments in accordance with principles of inventive concepts provide a method and apparatus for processing a substrate using an ion beam that may be capable of rapidly pre-heating a grid.

According to example embodiments, there may be provided a method of processing a substrate using an ion beam. In the method of processing the substrate using the ion beam, a first grid, which may be adjacent to a plasma chamber, among first to third grids between the plasma chamber and a substrate-processing chamber may be pre-heated using a radiant heater. A plasma may be generated in the plasma chamber. Ions in the plasma may be accelerated toward the first to third grids to form ion beams. The substrate in the substrate-processing chamber may be processed using the ion beam.

According to example embodiments, there may be provided an apparatus for processing a substrate using an ion beam. The apparatus may include a plasma chamber, a substrate-processing chamber, first to third grids, and a heater. A plasma may be generated in the plasma chamber. The substrate-processing chamber may be connected with the plasma chamber. The substrate-processing chamber may be configured to receive the substrate. The first to third grids may be arranged between the plasma chamber and the substrate-processing chamber. The heater may be configured to heat the first grid, nearest the plasma chamber, among the first to third grids.

According to example embodiments, the first grid adjacent to the plasma chamber may be heated using radiant heat so that the time for pre-heating the first grid may be greatly reduced, thereby eliminating the need for a dummy substrate employed while preheating the grid at a relatively slow rate using the plasma so that yield and throughput of semiconductor devices may be improved.

In an example embodiment a method of processing a substrate includes forming a plasma in a plasma chamber, using charged grids to form an ion beam and to thereby accelerate ions from the plasma chamber to a processing chamber and using an auxiliary heater to pre-heat a grid to a saturation state.

BRIEF DESCRIPTION OF THE DRAWINGS

Example embodiments will be more clearly understood from the following detailed description taken in conjunction with the accompanying drawings.

FIG. 1 is a cross-sectional view illustrating an ion beam etching apparatus in accordance with example embodiments;

FIG. 2 is an enlarged cross-sectional view illustrating a grid and a heater of the ion beam etching apparatus in FIG. 1;

FIGS. 3 to 5 are cross-sectional views illustrating an ion beam etching method using the ion beam etching apparatus in FIG. 1;

FIG. 6 is a cross-sectional view illustrating an ion beam etching apparatus in accordance with example embodiments;

FIG. 7 is an enlarged cross-sectional view illustrating a grid and a heater of the ion beam etching apparatus in FIG. 6;

FIGS. 8 to 10 are cross-sectional views illustrating an ion beam etching method using the ion beam etching apparatus in FIG. 6;

FIG. 11 is a cross-sectional view illustrating an ion beam etching apparatus in accordance with example embodiments;

FIGS. 12 to 15 are cross-sectional views illustrating an ion beam etching method using the ion beam etching apparatus in FIG. 11;

FIG. 16 is a cross-sectional view illustrating an ion beam etching apparatus in accordance with example embodiments; and FIGS. 17 to 20 are cross-sectional views illustrating an ion beam etching method using the ion beam etching apparatus in FIG. 16.

DETAILED DESCRIPTION OF THE EMBODIMENTS

Hereinafter, example embodiments will be explained in detail with reference to the accompanying drawings.

Figure 1:
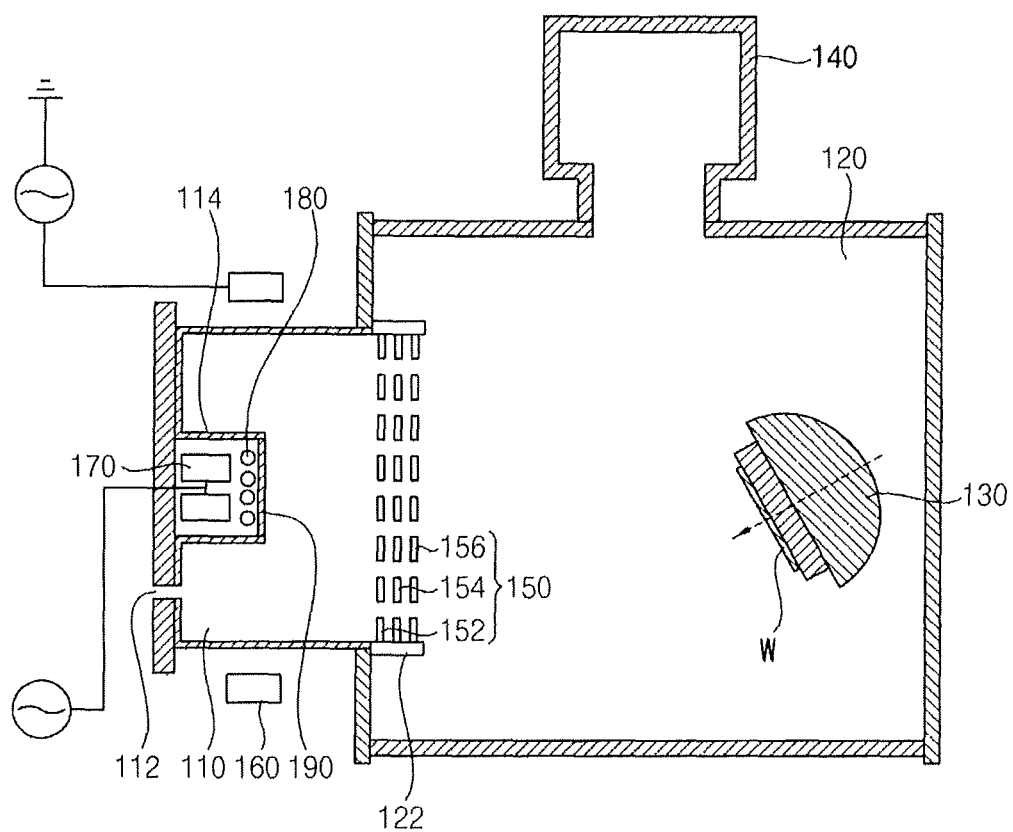
FIGS. 1 to 20 represent non-limiting, example embodiments as described herein.
Figure 2:
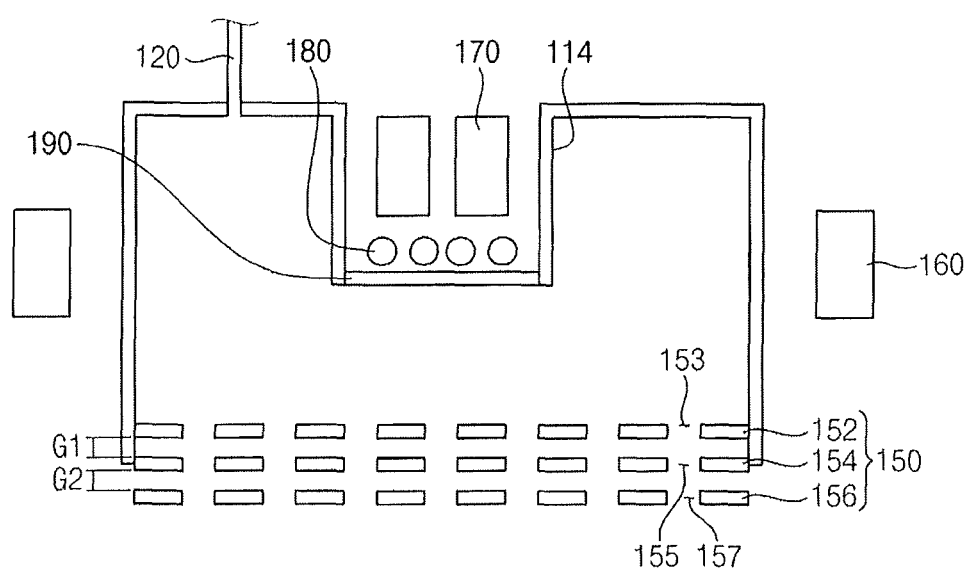

FIG. 1 is a cross-sectional view illustrating an example embodiment of an ion beam etching apparatus in accordance with principles of inventive concepts, and FIG. 2 is an enlarged cross-sectional view illustrating a grid and a heater of the ion beam etching apparatus in FIG. 1.

Referring to FIGS. 1 and 2, an example embodiment of an apparatus for processing a substrate using an ion beam in accordance with principles of inventive concepts may include an etching apparatus. The etching apparatus may be configured to etch a layer on the substrate W using the ion beam.

The etching apparatus may include a plasma chamber 110, an etching chamber 120, a substrate holder 130, an exhaust line 140, a grid structure 150, an RF coil 160, a magnet 170, a heater 180 and a lens 190. Heater 180 may be referred to herein as an auxiliary, or supplemental, heater, in that conventional apparatus do not include such a heater but, rather, generate a plasma to pre-heat the grid while a dummy substrate is in the processing chamber.

The plasma chamber 110 may include a receiving portion 114. The receiving portion 114 may be formed at a central portion of a rear surface of the plasma chamber 110 opposite to the etching chamber 120. The receiving portion 114 may have a cylindrical shape.

A gas inlet line 112 may be connected to the plasma chamber 110. An etching gas may be introduced into the plasma chamber 110 through the gas inlet line 112.

The RF coil 160 may be configured to surround an outer surface of the plasma chamber 110. The RF coil 160 may be electrically connected with a power source and may form, or generate, a high frequency electric field for generating plasma in the plasma chamber 110.

The magnet 170 may be arranged in the receiving portion 114 of the plasma chamber 110 and may uniformly distribute the plasma generated by the RF coil 160. The distribution of the plasma may be controlled by controlling the amount of a current supplied to the magnet 170, for example.

The etching chamber 120 may communicate with the plasma chamber 110. The substrate holder 130 may be arranged in the etching chamber 120 and may have a pivotal structure for inclining the substrate W with respect to an irradiation direction of the ion beam. The substrate holder 130 may include an electrostatic chuck (ESC).

The exhaust line 140 may be connected to the etching chamber 120. Byproducts generated in an etching process may be exhausted from the etching chamber 120 through the exhaust line 140. Because the substrate holder 130 may be downwardly slanted, the exhaust line 140 may be connected to an upper surface of the etching chamber 120 in order to prevent flows of the ion beam from being influenced by vacuum supplied from the exhaust line 140.

The grid structure 150 may be arranged between the plasma chamber 110 and the etching chamber 120. In example embodiments, the grid structure 150 may include a first grid 152, a second grid 154 and a third grid 156. The first grid 152 may be adjacent to the plasma chamber 110. The third grid 156 may be adjacent to the etching chamber 120. The second grid 154 may be arranged between the first grid 152 and the third grid 156.

The first grid, 152, the second grid 154 and the third grid 156 may be fixed to clamping plates 122. The clamping plates 122 may be positioned at both ends of the first to third grids 152, 154 and 156 and, in this manner, both ends of the first to third grids 152, 154 and 156 may be fixed to the clamping plates 122.

In example embodiments, the first to third grids 152, 154 and 156 may have substantially the same size. A first gap G1 between the first grid 152 and the second grid 154 may be substantially the same as a second gap G2 between the second grid 154 and the third grid 156.

The first grid 152 and the second grid 154 may be electrically connected to a power source. In example embodiments, the first grid 152 may be connected to an anode and the second grid 154 may be connected to a cathode. The third grid 156 may be grounded. The first to third grids 152, 154 and 156 may include, respectively, first to third holes 153, 155 and 157 through which the ion beams may pass. The first to third holes 153, 155 and 157 may have substantially the same size. The first to third holes 153, 155 and 157 may be arranged in substantially the same axial direction.

The heater 180 may be arranged in the receiving portion 114 of the plasma chamber 110 and may be arranged between the magnet 170 and the first grid 152. The ion beam etching apparatus may be idly driven before performing the etching process and the heater 180 may pre-heat the grid structure 150, particularly the first grid 152 adjacent to the plasma chamber 110, using radiant heat. The radiant heat may be more rapidly transferred to the first grid 152 than plasma heating. Therefore, in example embodiments, the first grid 152 may rapidly heated to a saturation temperature using radiant heat, rather than plasma heating. The term, "saturation state" may also be used herein to refer to a state at which the grid reaches a point beyond which it distorts no further due to heating. The use of "state" makes explicit what the use of "temperature" implies: that the grid may be at the saturation temperature for some period of time before temperature-induced distortion is complete.

Ion beams that pass through a central portion of the grid structure 150 may provide the bulk of etching of the layer on the substrate W fixed to the substrate holder 130. That is, ion beams passing through an edge portion of the grid structure 150 may provide little or none of the etching of the layer on the substrate W. As a result, an etching uniformity may be determined by characteristics of the ion beams passing through the central portion of the grid structure 150.

In example embodiments the heater 180 may be arranged in the receiving portion 114 at the central portion of the plasma chamber 110 and, as a result, the heater 180 may concentratedly pre-heat a central portion of the first grid 152. In particular, the heater 180 may radiantly pre-heat the central portion of the first grid 152 to the saturation temperature, the temperature at which the expansion of the first grid 152 stops. The saturation temperature may vary in accordance with a material of the first grid 152.

Because both ends of the first grid 152 may be fixed to the clamping plates 122, the first grid 152 pre-heated by the heater 180 may be expanded and the central portion of the first grid 152 may be slightly protruded toward the heater 180. As a result of this protrusion, or cupping, the gap between the central portion of the first grid 152 and a central portion of the second grid 154 may be greater than the gap between an edge portion of the first grid 152 and an edge portion of the second grid 154. In order to compensate for the distortion of the first grid, etching recipes may be based on the shape of the first grid 152, after expansion. In example embodiments in accordance with principles of inventive concepts, the thermal expansion rate of the first grid 152 at the saturation temperature are taken into account, the distortion of the first grid 152 resulting from heating is determined, and the distortion of first grid 152 is taken into account in etching recipes in order to pre-compensate for the distortion. In accordance with principles of inventive concepts, heater 180 may be used to pre-heat the first grid 152 using radiant heat in order to expand, or distort, the first grid 152 into a shape for which an etching recipe has been developed.

In example embodiments, the heater 180 may include a halogen lamp or other heating element configured to generate the requisite radiant heat.

In example embodiments, the lens 190 may be arranged between the heater 180 and the first grid 152. The lens 190 may be configured to diffuse the radiant heat generated from the heater 180 toward the first grid 152 in order to uniformly transfer the radiant heat from the heater 180 to the central portion of the first grid 152. In example embodiments the lens 190 may include a concave lens configured to diffuse the heat.

Figure 3:
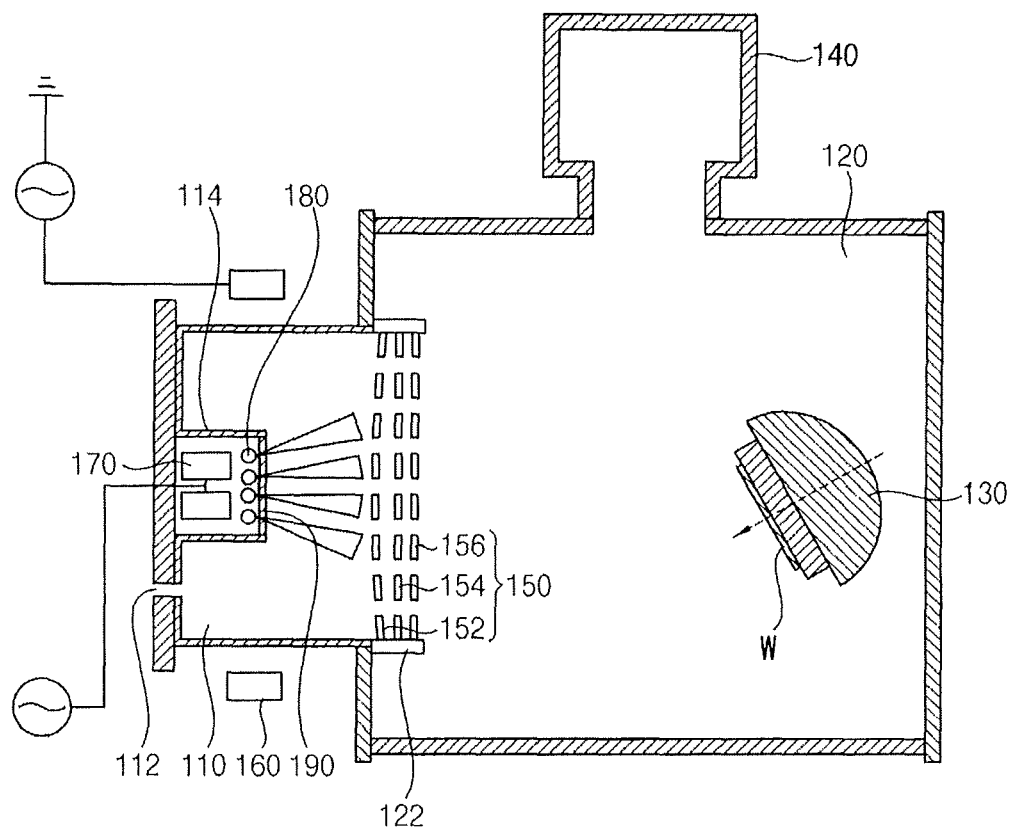
Figure 4:
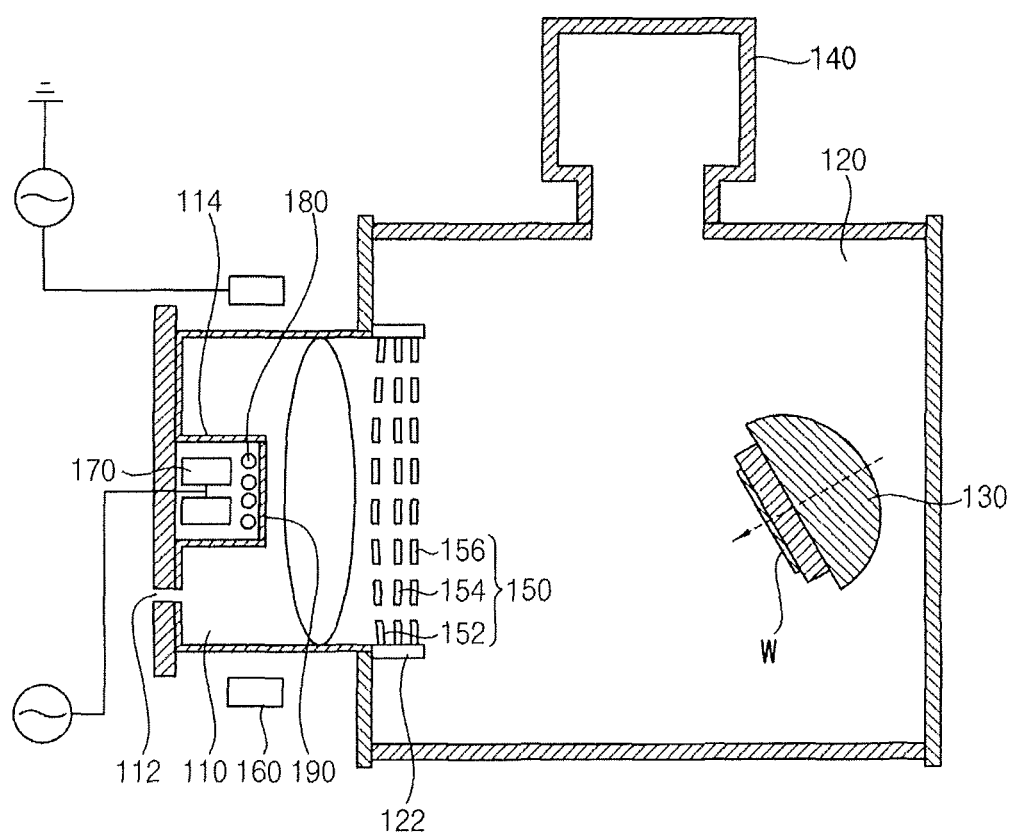
Figure 5:
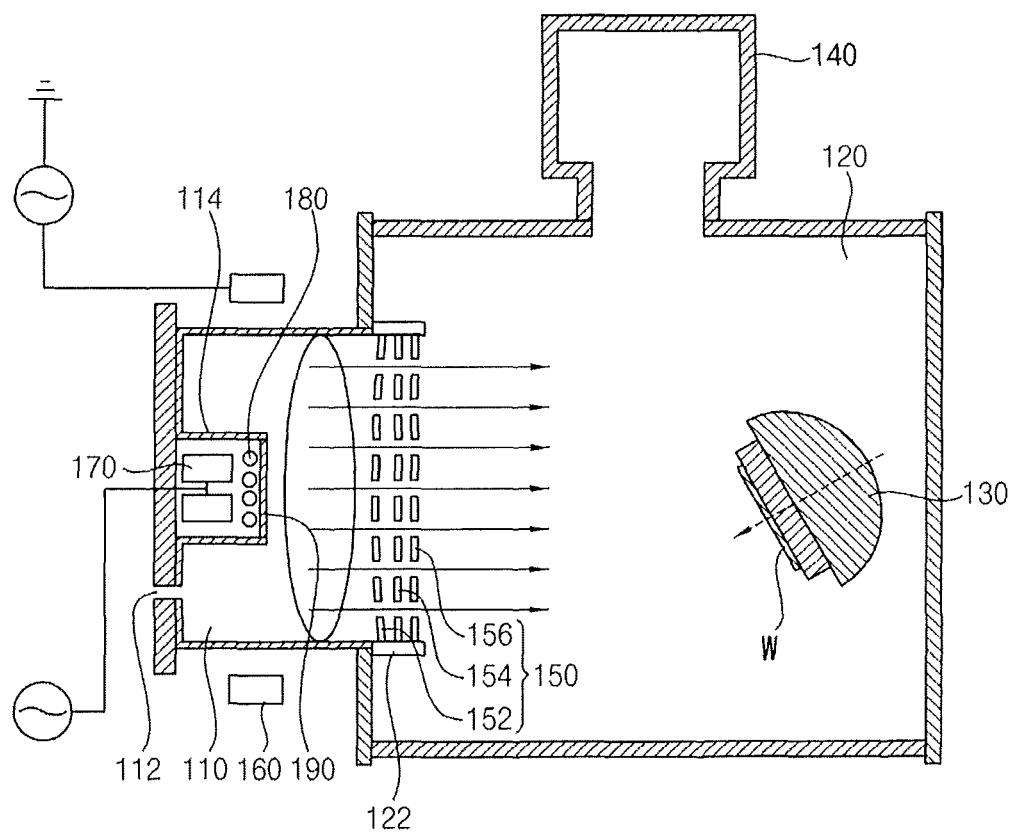

FIGS. 3 to 5 are cross-sectional views illustrating an example embodiment of an ion beam etching method using the ion beam etching apparatus in FIG. 1.

Referring to FIG. 3, the etching recipes may be set based on the thermal expansion of the first grid 152. That is, the etching recipes may be set under a condition that the first gap G1 between the first grid 152 and the second grid 154 may be wider than the second gap G2 between the second grid 154 and the third grid 156. In example embodiments in accordance with principles of inventive concepts, etching recipes may compensate for the gap G1 being wider than the gap G2 and may also take into account the curvature of first grid 152 that results from thermal expansion.

The substrate W on which the layer may be formed may be fixed to the substrate holder 130. Before performing the etching process, the heater 180 may pre-heat the central portion of the first grid 152 up to the saturation temperature, using the radiant heat from heater 180. The radiant heat generated from the heater 180 may be diverged by the lens 190 in order to uniformly distribute radiant heat over the central portion of the first grid 152.

As a result of the heating, the central portion of the first grid 152 may be slightly protruded toward the heater 180; the first gap G1 between the expanded first grid 152 and the second grid 154 may become wider than the second gap G2 between the second grid 154 and the third grid 156; and, in accordance with principles of inventive concepts, the etching recipes may be set based on the expanded shape of the first grid 152 in order to precompensate for the thermal distortion of the first grid 152.

Referring to FIG. 4, the heater 180 may be stopped after the first grid 152, or, at least, the central portion of the first grid 152, has reached the saturation temperature. A source gas may then be introduced into the plasma chamber 110 through the gas inlet line 112 and high frequency power may be applied to the RF coil 160 to generate the plasma in the plasma chamber 110 from the source gas. Because the first grid 152 has already been heated to the saturation temperature and is fully expanded, the process need not wait for the first grid 152 to be expanded by the slower process of heating from the plasma.

Referring to FIG. 5, ions in the plasma may be accelerated toward the charged grid structure 150. The ions may pass through the holes 153, 155 and 157 in the grid structure 150 to be converted into the ion beams. The ion beams may be irradiated to the layer on the substrate W fixed to the substrate holder 130 to etch the layer.

Byproducts generated in the etching process may be exhausted from the etching chamber 120 through the exhaust line 140.

Figure 6:
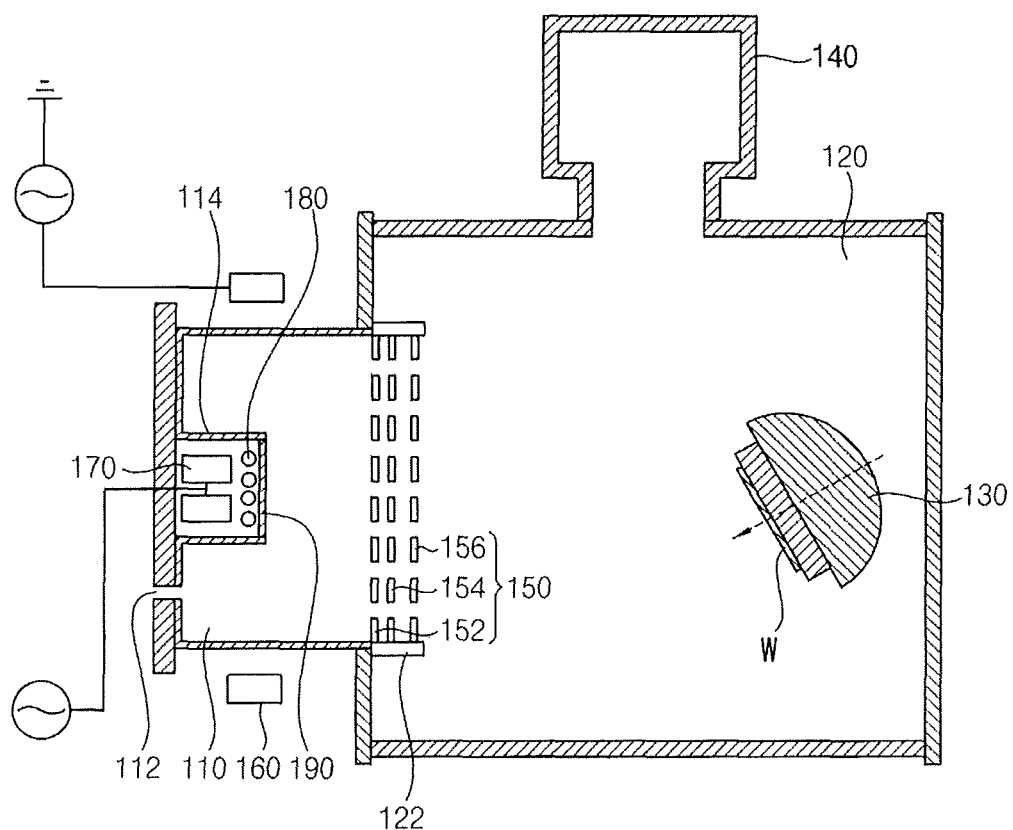
Figure 7:
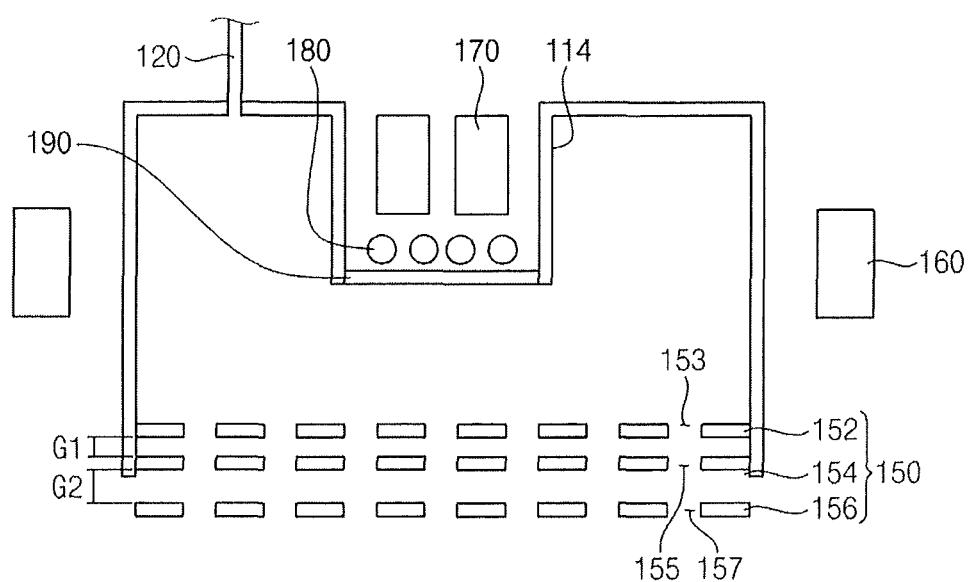

FIG. 6 is a cross-sectional view illustrating an example embodiment of an ion beam etching apparatus in accordance with principles of inventive concepts, and FIG. 7 is an enlarged cross-sectional view illustrating a grid and a heater of the ion beam etching apparatus in FIG. 6.

An etching apparatus using an ion beam in accordance with this example embodiment may include elements substantially the same as those of the etching apparatus in FIG. 1 except for a grid structure. Thus, the same reference numeral may refer to the same elements and any further illustrations with respect to the same elements may not be repeated herefor brevity and clarity of description.

Referring to FIGS. 6 and 7, a first gap G1 between the first grid 152 and the second grid 154 may be narrower than a second gap G2 between the second grid 154 and the third grid 156.

The heater 180 may pre-heat the central portion of the first grid 152 to the saturation temperature using radiant heat and the central portion of the first grid 152 may be expanded so that a gap between the central portion of the first grid 152 and the central portion of the second grid 154 may be substantially the same as a gap between the central portion of the second grid 154 and the central portion of the third grid 156.

As previously described, the ion beams employed in the etching process, may correspond, predominantly, to the ion beams passing through the central portion of the grid structure 150. Thus, in this example embodiment, although a gap between the edge portion of the first grid 152 and the edge portion of the second grid 154 may be narrower than a gap between the edge portion of the second grid 154 and the edge portion of the third grid 156, the gap between the pre-heated central portion of the first grid 152 and the central portion of the second grid 154 may be substantially the same as the gap between the central portion of the second grid 154 and the central portion of the third grid 156, As a result, etching uniformity may be improved.

In this example embodiment, etching recipes may be set assuming that the first gap G1 between the first grid 152 and the second grid 154 may be substantially the same as the second gap G2 between the second grid 154 and the third grid 156.

Figure 8:
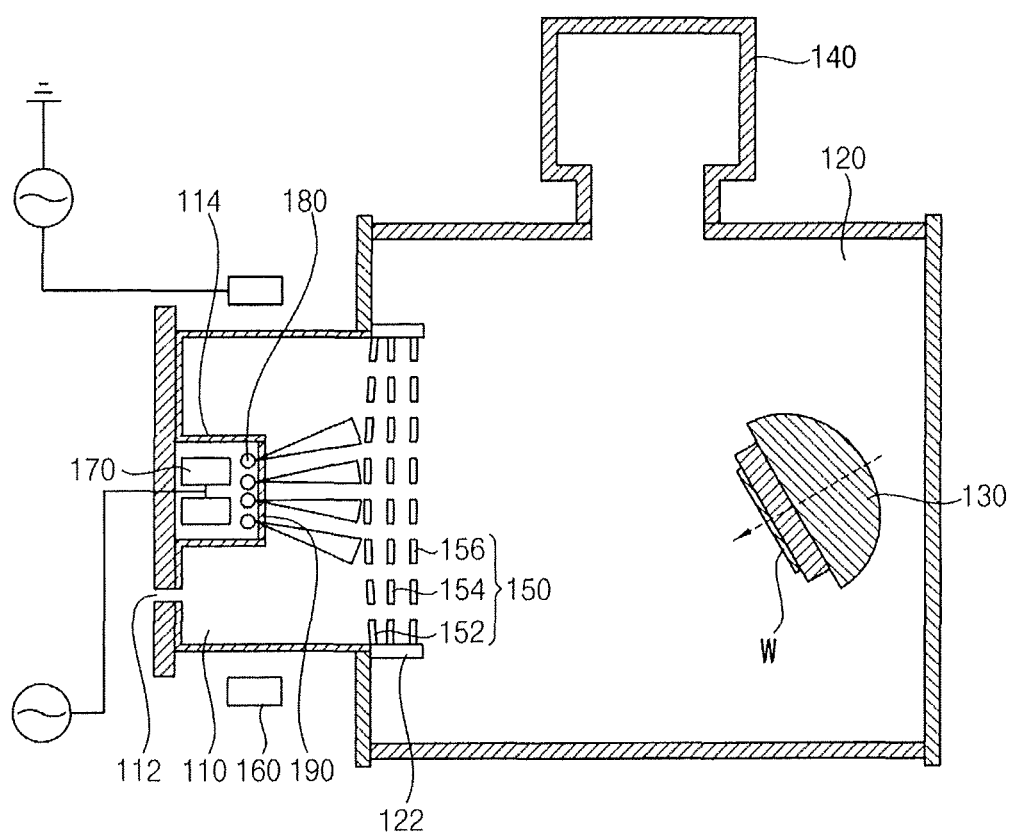
Figure 9:
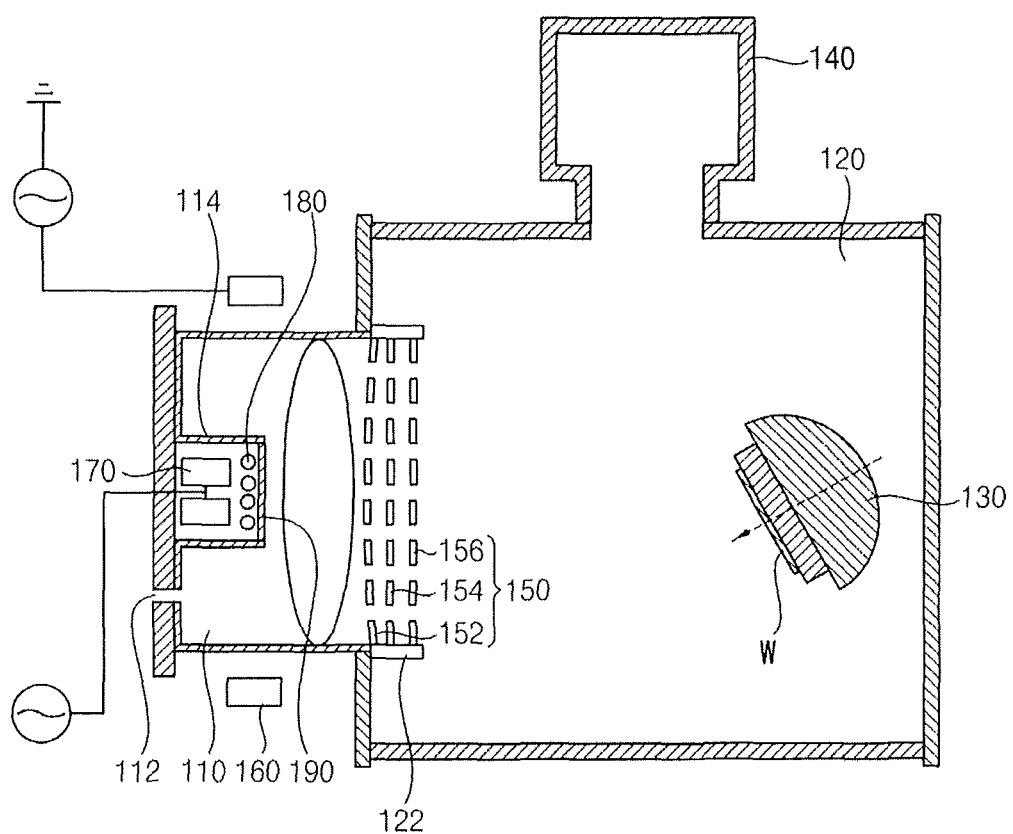
Figure 10:
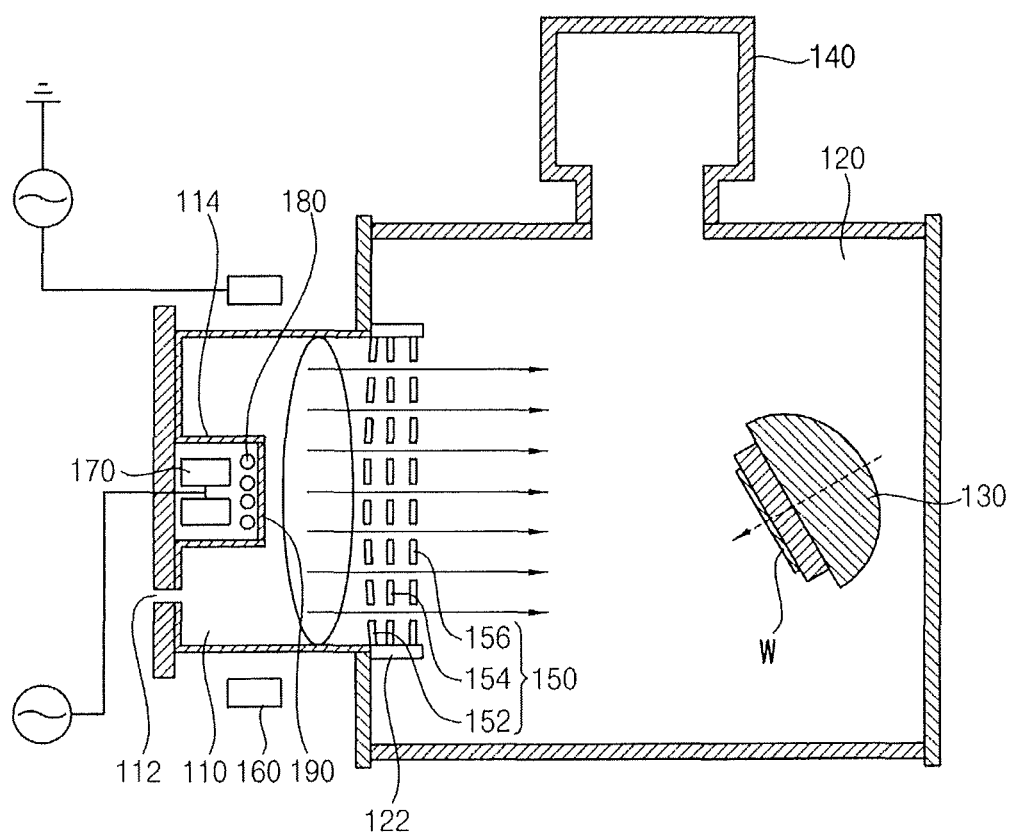

FIGS. 8 to 10 are cross-sectional views illustrating an ion beam etching method using the ion beam etching apparatus in FIG. 6.

Referring to FIG. 8, the etching recipes may be set assuming that the first gap G1 between the first grid 152 and the second grid 154 may be substantially the same as the second gap G2 between the second grid 154 and the third grid 156.

The substrate W on which the layer may be formed may be fixed to the substrate holder 130 and, before performing the etching process, the heater 180 may pre-heat the central portion of the first grid 152 to the saturation temperature using radiant heat. The radiant heat generated by the heater 180 may be diverged by the lens 190 in order to uniformly transfer heat to the central portion of the first grid 152.

As a result of the heating by heater 180, the central portion of the first grid 152 may be slightly protruded toward the heater 180 and the first gap G1 between the expanded first grid 152 and the second grid 154 may be substantially the same as the second gap G2 between the second grid 154 and the third grid 156. In accordance with principles of inventive concepts, the etching recipes may be set based on the expanded shape of the first grid 152.

Referring to FIG. 9, the heater 180 may be stopped after the first grid, or, at least, the central portion of the first grid, 152 has reached the saturation temperature. A source gas may then be introduced into the plasma chamber 110 through the gas inlet line 112 and high frequency power may be applied to the RF coil 160 to generate the plasma in the plasma chamber 110 from the source gas. Because the first grid 152 has already been heated to the saturation temperature and is fully expanded, the process need not wait for the first grid 152 to be expanded by the slower process of heating from the plasma.

Referring to FIG. 10, ions in the plasma may be accelerated toward the charged grid structure 150. The ions may pass through the holes 153, 155 and 157 in the grid structure 150 to be converted into the ion beams. The ion beams may be irradiated to the layer on the substrate W fixed to the substrate holder 130 to etch the layer.

Byproducts generated in the etching process may be exhausted from the etching chamber 120 through the exhaust line 140.

Figure 11:
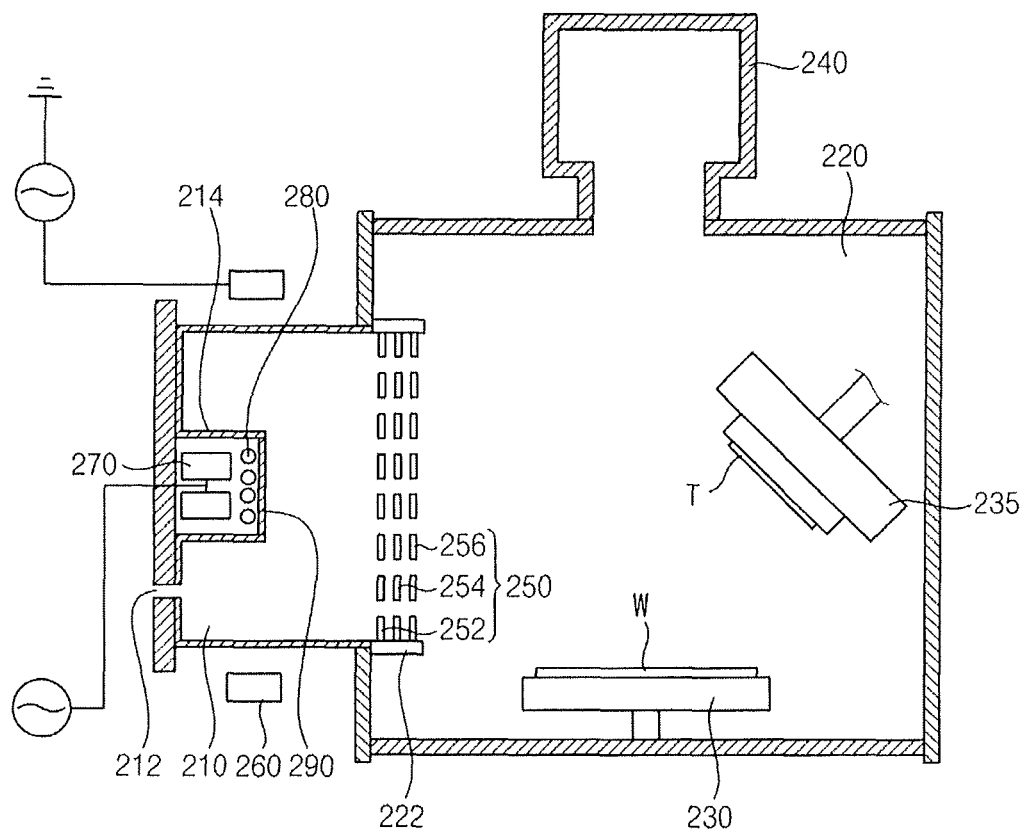

FIG. 11 is a cross-sectional view illustrating an example embodiment of an ion beam etching apparatus in accordance with principles of inventive concepts.

Referring to FIG. 11, an apparatus for processing a substrate using an ion beam in accordance with this example embodiment may include a deposition apparatus that may be configured to deposit a layer on the substrate W using the ion beam.

The deposition apparatus may include a plasma chamber 210, a receiving portion 214, a deposition chamber 220, clamping plates 222, a target holder 235, a substrate holder 230, an exhaust line 240, a grid structure 250, an RF coil 260, a magnet 270, a heater 280 and a lens 290.

The plasma chamber 210, the receiving portion 214, the deposition chamber 220, the clamping plates 222, the grid structure 250, the RF coil 260, the magnet 270, the heater 280 and the lens 290 in FIG. 11 may have functions and a structure substantially the same as those of the plasma chamber 110, the etching chamber 120, the grid structure 150, the RF coil 160, the magnet 170, the heater 180 and the lens 190, respectively. Thus, any further illustrations with respect to the plasma chamber 210, the deposition chamber 220, the grid structure 250, the RF coil 260, the magnet 270, the heater 280 and the lens 290 in FIG. 11 may not be repeated here, for brevity and clarity of explanation.

The target holder 235 may be arranged on a side surface of the deposition chamber 220 and may be downwardly slanted. A target T may be fixed to the target holder 235. The substrate holder 230 may be arranged on a bottom surface of the deposition chamber 220. The ion beams may be irradiated to the target T on the target holder 235. Materials released from the target T may be deposited on the substrate W on the substrate holder 230.

The exhaust line 240 may be connected to the deposition chamber 220. Because the target holder 235 may be downwardly slanted, the exhaust line 240 may be connected to an upper surface of the deposition chamber 220 so as to prevent flows of the ion beam from being influenced by vacuum supplied from the exhaust line 240.

FIGS. 12 to 15 are cross-sectional views illustrating an example embodiment of an ion beam etching method using the ion beam etching apparatus in FIG. 11.

Figure 12:
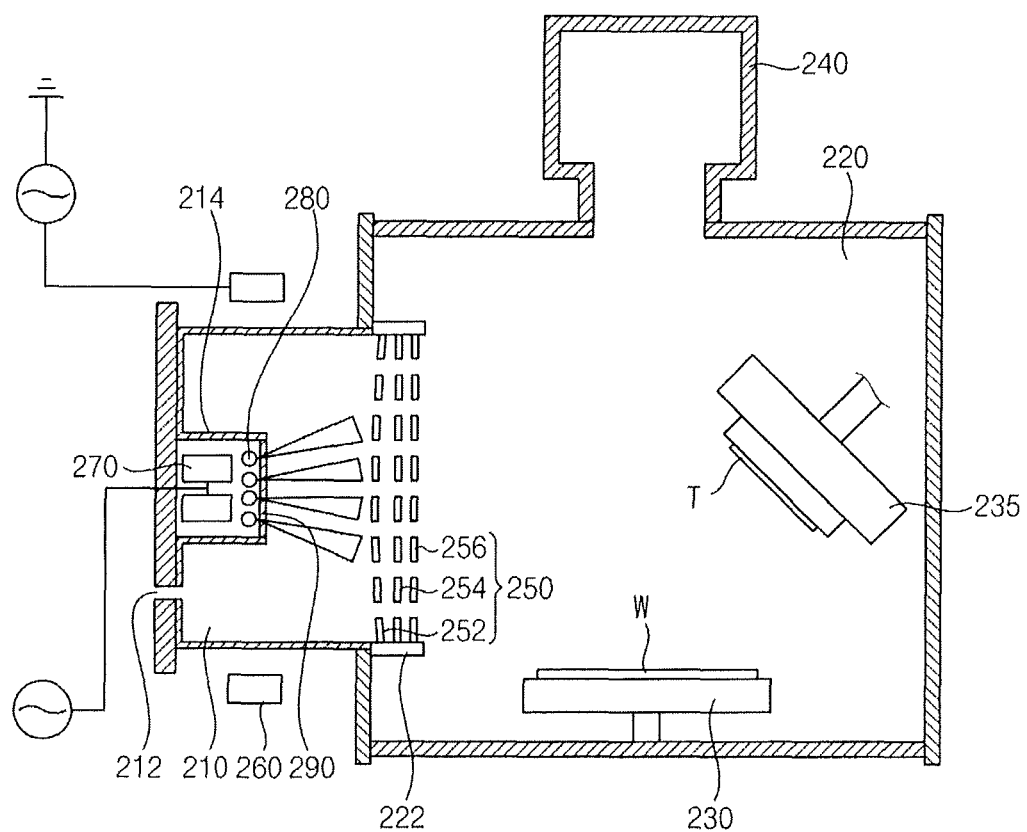

Referring to FIG. 12, the deposition recipes may be set based on the thermal expansion of the first grid 252. That is, the deposition recipes may be set under a condition that the first gap G1 between the first grid 252 and the second grid 254 may be wider than the second gap G2 between the second grid 254 and the third grid 256. In example embodiments in accordance with principles of inventive concepts, etching recipes may compensate for gap G1 being wider than gap G2 and may also take into account the curvature of first grid 252 that results from thermal expansion The target T may be fixed to the target holder 235. The substrate W on which the layer may be formed may be fixed to the substrate holder 230. Before performing the deposition process, the heater 280 may pre-heat the central portion of the first grid 252 up to the saturation temperature, using the radiant heat from the heater 280. The radiant heat generated from the heater 280 may be diverged by the lens 290 in order to uniformly distribute radiant heat over the central portion of the first grid 252.

As a result of the heating, the central portion of the first grid 252 may be slightly protruded toward the heater 280; the first gap G1 between the expanded first grid 252 and the second grid 254 may become wider than the second gap G2 between the second grid 254 and the third grid 256; and, in accordance with principles of inventive concepts, the deposition recipes may be set based on the expanded shape of the first grid 252 in order to precompensate for the thermal distortion of first grid 252.

Figure 13:
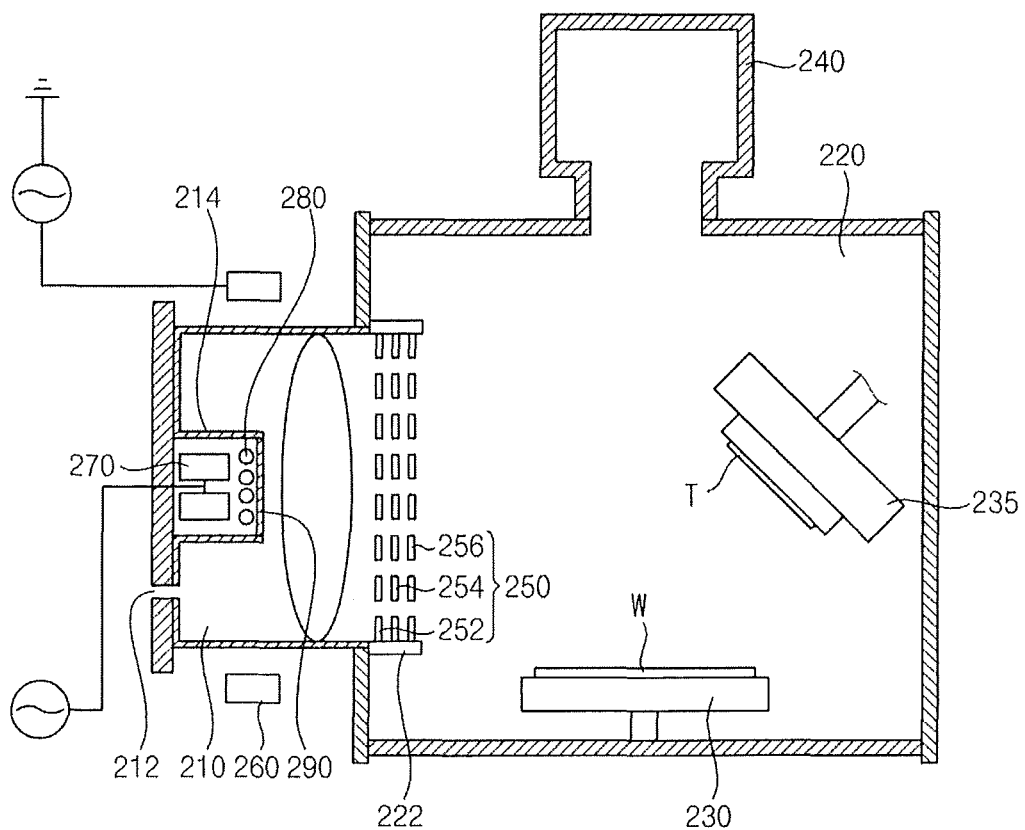

Referring to FIG. 13, the heater 280 may be stopped after the first grid 252, or, at least, the central portion of the first grid 252, has reached the saturation temperature. A source gas may then be introduced into the plasma chamber 210 through the gas inlet line 212 and high frequency power may be applied to the RF coil 260 to generate the plasma in the plasma chamber 210 from the source gas. Because the first grid 252 has already been heated to the saturation temperature and is fully expanded, the process need not wait for the first grid 252 to be expanded by the slower process of heating from the plasma.

Figure 14:
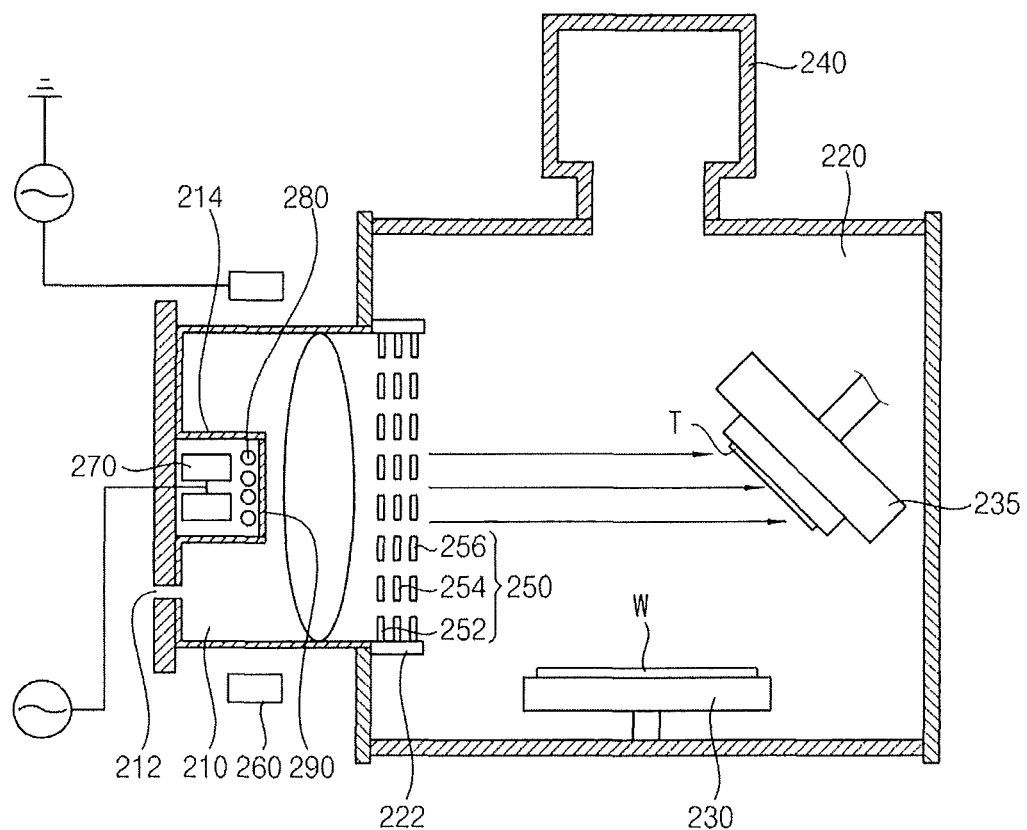

Referring to FIG. 14, ions in the plasma may be accelerated toward the charged grid structure 250. The ions may pass through the holes in the grid structure 250 to be converted into the ion beams. The ion beams may be irradiated to the target T on the target holder 235 so that the materials may be released from the target T.

Figure 15:
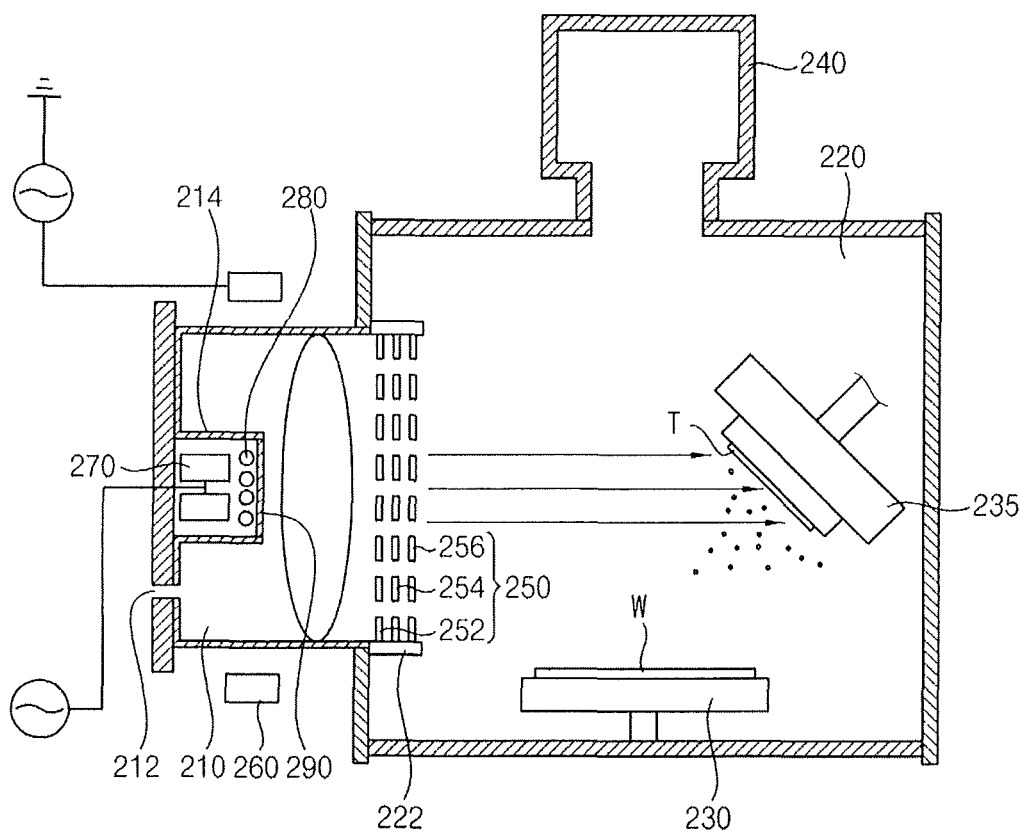

Referring to FIG. 15, the materials released from target T may be deposited on the substrate W on the substrate holder 230. Byproducts generated in the deposition process may be exhausted from the deposition chamber 220 through the exhaust line 240.

Figure 16:
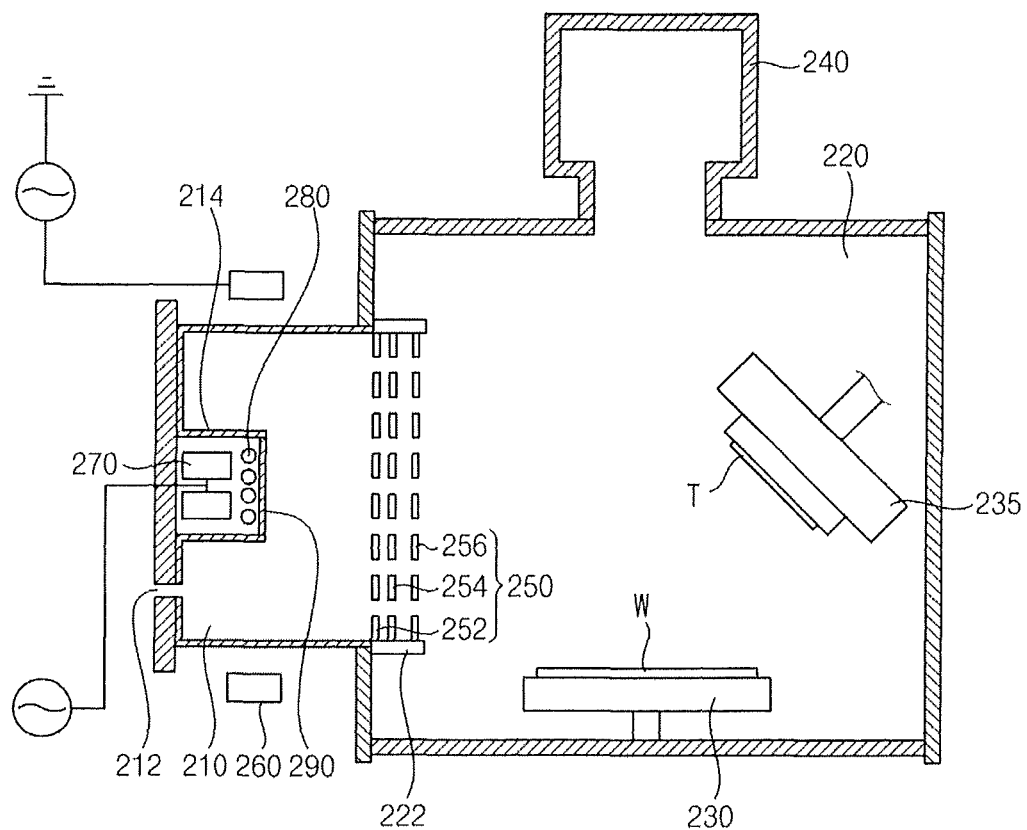

FIG. 16 is a cross-sectional view illustrating example embodiment of an ion beam etching apparatus in accordance with principles of inventive concepts.

Referring to FIG. 16, a first gap G1 between the first grid 252 and the second grid 254 may be narrower than a second gap G2 between the second grid 254 and the third grid 256.

The heater 280 may pre-heat the first grid 252, or, at least, the central portion of the first grid 252 to the saturation temperature using radiant heat. Thus, the pre-heated central portion of the first grid 252 may be expanded so that a gap between the central portion of the first grid 252 and the central portion of the second grid 254 may be substantially the same as a gap between the central portion of the second grid 254 and the central portion of the third grid 256.

As previously described, the ion beams employed in the deposition process may correspond, predominantly, to the ion beams passing through the central portion of the grid structure 250. Thus, in this example embodiment, although a gap between the edge portion of the first grid 252 and the edge portion of the second grid 254 may be narrower than a gap between the edge portion of the second grid 254 and the edge portion of the third grid 256, the gap between the pre-heated central portion of the first grid 252 and the central portion of the second grid 254 may be substantially the same as the gap between the central portion of the second grid 254 and the central portion of the third grid 256. As a result, the layer deposited on the substrate W may have a uniform thickness.

In this example embodiment, deposition recipes may be set assuming that the first gap G1 between the first grid 252 and the second grid 254 may be substantially the same as the second gap G2 between the second grid 254 and the third grid 256.

FIGS. 17 to 20 are cross-sectional views illustrating an example embodiment of an ion beam etching method using the ion beam etching apparatus in FIG. 16.

Figure 17:
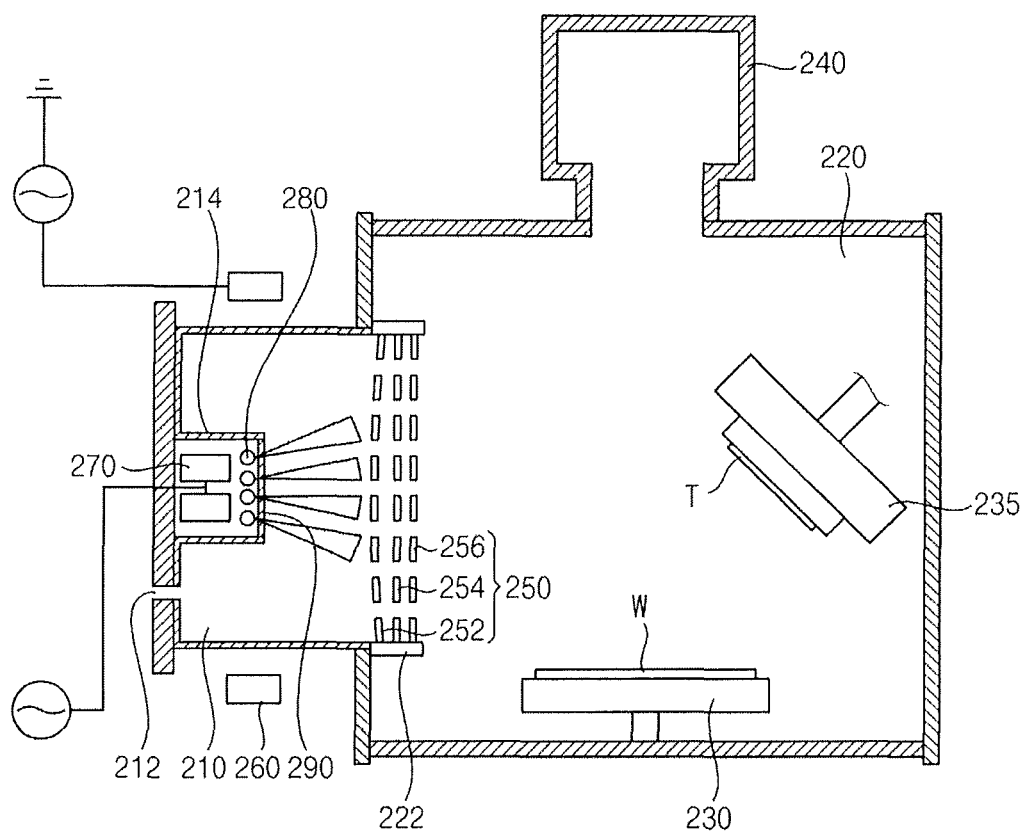

Referring to FIG. 17, the deposition recipes may be set assuming that the first gap G1 between the first grid 252 and the second grid 254 may be substantially the same as the second gap G2 between the second grid 254 and the third grid 256.

The target T may be fixed to the target holder 235. The substrate W on which the layer may be formed may be fixed to the substrate holder 230 and, before performing the deposition process, the heater 280 may pre-heat the central portion of the first grid 252 to the saturation temperature using radiant heat. The radiant heat generated by the heater 180 may be diverged by the lens 290 in order to uniformly transfer heat to the central portion of the first grid 252.

As a result of the heating by heater 280, the central portion of the first grid 252 may be slightly protruded toward the heater 280 and the first gap G1 between the expanded first grid 252 and the second grid 254 may be substantially the same as the second gap G2 between the second grid 254 and the third grid 256. In accordance with principles of inventive concepts, deposition recipes may be set based on the expanded shape of the first grid 252.

Figure 18:
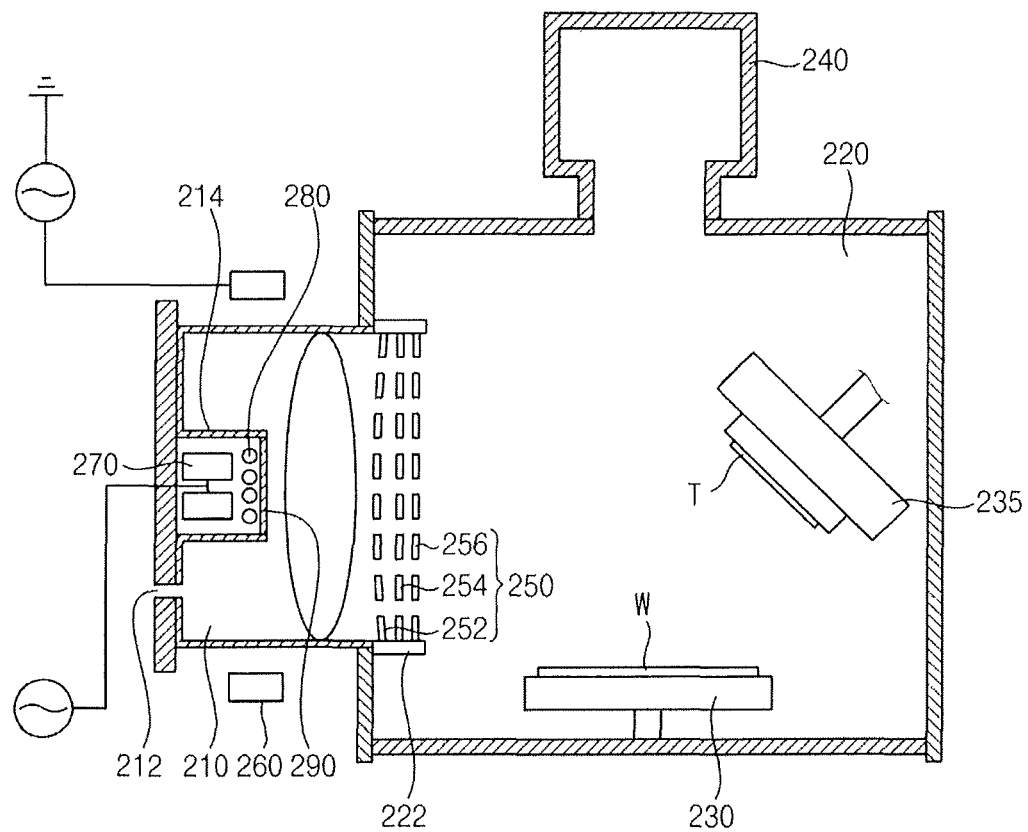

Referring to FIG. 18, the heater 280 may be stopped after the first grid 252, or, at least, the central portion of the first grid 252, has reached the saturation temperature. A source gas may then be introduced into the plasma chamber 210 through the gas inlet line 212 and high frequency power may be applied to the RF coil 260 to generate the plasma in the plasma chamber 210 from the source gas. Because the first grid 252 has already been heated to the saturation temperature and is fully expanded, the process need not wait for the first grid 252 to be expanded by the slower process of heating from the plasma.

Figure 19:
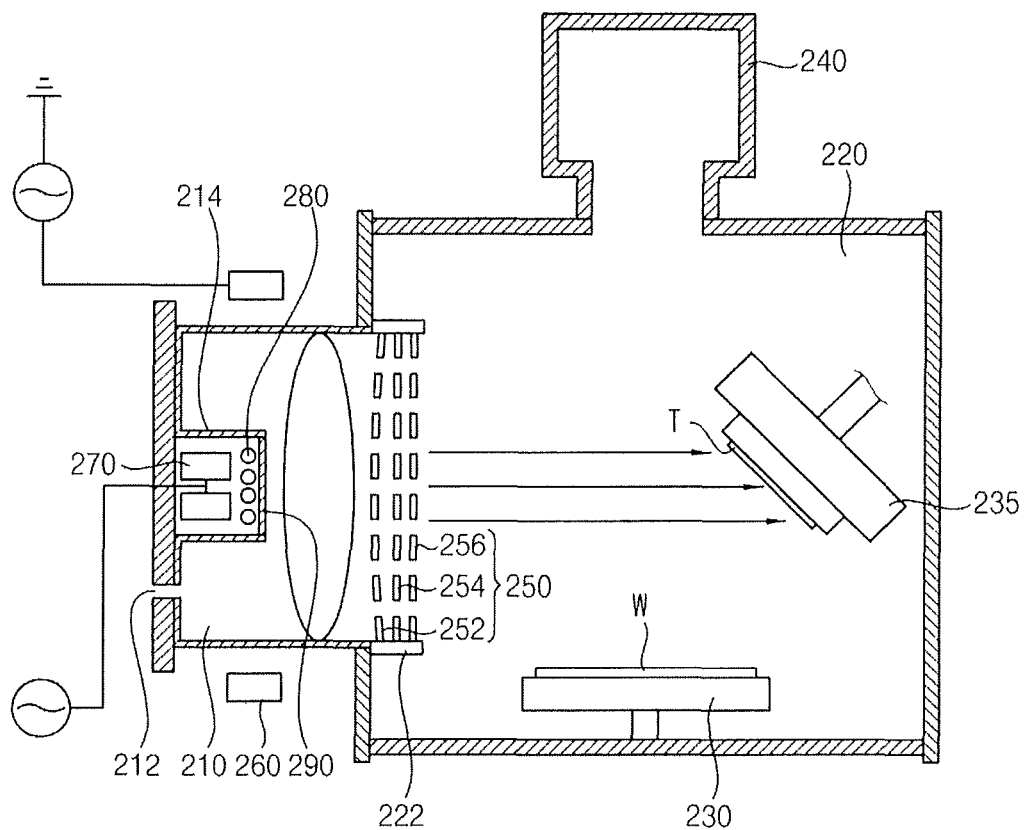

Referring to FIG. 19, ions in the plasma may be accelerated toward the charged grid structure 250. The ions may pass through the holes in the grid structure 250 to be converted into the ion beams. The ion beams may be irradiated to the target T on the target holder 235 so that the materials may be released from the target T.

Figure 20:
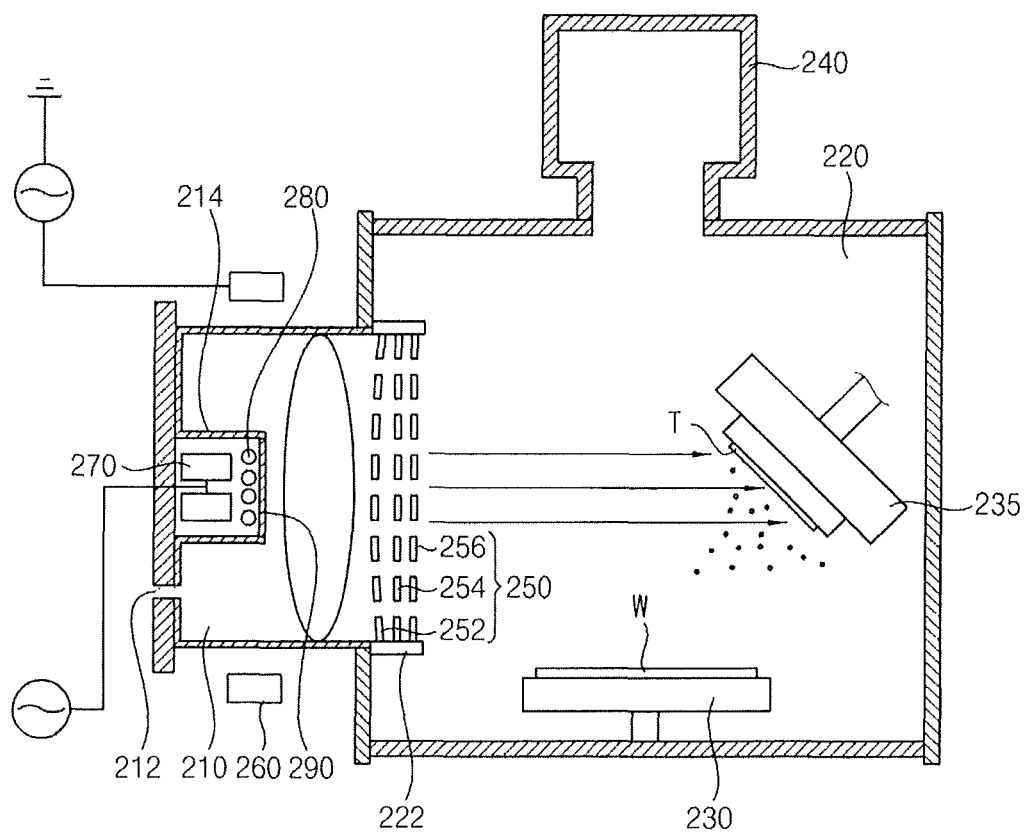

Referring to FIG. 20, the materials may be deposited on the substrate W on the substrate holder 230. Byproducts generated in the deposition process may be exhausted from the deposition chamber 220 through the exhaust line 240.

According to example embodiments, the first grid adjacent to the plasma chamber may be heated using radiant heat so that the time for pre-heating the first grid may be greatly reduced, when compared to a process that relies upon plasma heating the first grid. As a result, a process for pre-heating the first grid using a dummy substrate and the plasma may not be required and the yield and throughput of semiconductor devices may be improved.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of processing a substrate using ion beams, the method comprising:

using radiant heat to pre-heat a first grid among the first grid, a second grid and a third grid that are arranged between a plasma chamber and a substrate-processing chamber, with the first grid nearest the plasma chamber, the third grid nearest the processing chamber and the second grid between the first and third grids;

generating a plasma in the plasma chamber;

accelerating ions from the plasma chamber toward the grids to form the ion beams; and processing the substrate in the substrate-processing chamber using the ion beams, wherein the using radiant heat to pre-heat the first grid comprises heating the first grid using an auxiliary heater positioned in the plasma chamber nearer to the first grid than the second and third grids, wherein the auxiliary heater is positioned at a central portion of the plasma chamber, and wherein the grids are fixed to clamping plates separate from the auxiliary heater.

2. The method of claim 1, wherein a pre-heated gap between the first grid and the second grid is substantially the same as a gap between the second grid and the third grid, and pre-heating the first grid widens the gap between the first grid and the second grid.

3. The method of claim 2, wherein pre-heating the first grid comprises pre-heating a central portion of the first grid to widen a gap between the central portion of the first grid and a central portion of the second grid to a point where the gap between central portions of the first and second grids is greater than a gap between edge portions of the first and second grids.

4. The method of claim 1, wherein a gap between the first grid and the second grid is narrower than a gap between the second grid and the third grid, and pre-heating the first grid comprises equalizing the gap between the first grid and the second grid to the gap between the second grid and the third grid.

5. The method of claim 4, wherein pre-heating the first grid comprises pre-heating a central portion of the first grid to equalize a gap between the central portion of the first grid and a central portion of the second grid with a gap between an edge portion of the first grid and an edge portion of the second grid.

6. The method of claim 1, wherein pre-heating the first grid comprises pre-heating the first grid to a saturation temperature beyond which the first grid does not expand.

7. The method of claim 1, wherein pre-heating the first grid comprises diverging the radiant heat toward the first grid.

8. The method of claim 1, wherein processing the substrate using the ion beams comprises etching a layer on the substrate using the ion beams.

9. The method of claim 1, wherein processing the substrate using the ion beams comprises:
irradiating the ion beams to a target in the substrate-processing chamber; and
depositing materials, which are released from the target, on the substrate.

10. The method of claim 1, wherein the using radiant heat to pre-heat the first grid is performed prior to generating a plasma in the plasma chamber.

11. A method of processing a substrate, comprising:
forming a plasma in a plasma chamber having a first end and a second end;
using charged grids to form an ion beam and to thereby accelerate ions from the plasma chamber to a processing chamber, the charged grids being positioned proximate to the second end of the plasma chamber; and
using an auxiliary heater to pre-heat a grid to a saturation state prior to forming the plasma in the plasma chamber,
wherein the auxiliary heater is in the plasma chamber between the first end of the plasma chamber and the charged grids and the auxiliary heater is positioned at a central portion of the plasma chamber, and
wherein the grids are fixed to clamping plates separate from the auxiliary heater.

12. The method of claim 11, wherein pre-heating the grid comprises heating a grid proximate the plasma chamber to a point where the grid is distorted by the heat to a saturation state.

13. The method of claim 12, wherein a processing recipe pre-compensates for distortion of the grid.

14. The method of claim 13 wherein the process carried out in the processing chamber is an etching process.

15. The method of claim 13, wherein the process carried out in the processing chamber is a deposition process.

* * * * *